US009679647B2

(12) United States Patent
Ueki et al.

(10) Patent No.: US 9,679,647 B2
(45) Date of Patent: Jun. 13, 2017

(54) SEMICONDUCTOR MEMORY DEVICE INCLUDING A RESISTANCE CHANGE ELEMENT AND A CONTROL CIRCUIT FOR CHANGING RESISTANCE OF THE RESISTANCE CHANGE ELEMENT

(71) Applicant: Renesas Electronics Corporation, Koutou-ku, Tokyo (JP)

(72) Inventors: Makoto Ueki, Tokyo (JP); Koji Masuzaki, Tokyo (JP); Masaharu Matsudaira, Tokyo (JP); Takashi Hase, Tokyo (JP); Yoshihiro Hayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/099,660

(22) Filed: Apr. 15, 2016

(65) Prior Publication Data
US 2016/0365144 A1 Dec. 15, 2016

(30) Foreign Application Priority Data
Jun. 10, 2015 (JP) ................................ 2015-117585

(51) Int. Cl.
*G11C 11/00* (2006.01)
*G11C 13/00* (2006.01)

(52) U.S. Cl.
CPC ...... *G11C 13/0069* (2013.01); *G11C 13/0064* (2013.01); *G11C 13/004* (2013.01); *G11C 2013/0066* (2013.01); *G11C 2013/0073* (2013.01); *G11C 2013/0092* (2013.01); *G11C 2213/79* (2013.01); *G11C 2213/82* (2013.01)

(58) Field of Classification Search
CPC .................................................. G11C 13/0002
USPC ......................................................... 365/148
See application file for complete search history.

(56) References Cited

U.S. PATENT DOCUMENTS

| 8,593,853 B2 | 11/2013 | Katoh | |
|---|---|---|---|
| 9,001,557 B2 | 4/2015 | Kawai et al. | |
| 2013/0223131 A1* | 8/2013 | Takagi | G11C 13/0007 365/148 |
| 2014/0301129 A1* | 10/2014 | Kawai | G11C 13/0069 365/148 |

(Continued)

FOREIGN PATENT DOCUMENTS

| JP | 4838399 B2 | 12/2011 |
|---|---|---|
| JP | 5250726 B1 | 7/2013 |

*Primary Examiner* — Hoai V Ho
(74) *Attorney, Agent, or Firm* — Shapiro, Gabor and Rosenberger, PLLC

(57) ABSTRACT

Included are memory cells each including a resistance change element and a control circuit. The circuit performs an On writing process for applying, to the memory cell, an On writing pulse for the cell to be in a resistance state where a resistance value of the resistance change element is lower than a first reference value and an Off writing process for applying an Off writing pulse with an opposite polarity to the On writing pulse for a high resistance state with a second reference value or greater. The circuit applies, in the On writing process, a trial pulse having the same polarity as that of the On writing pulse and having the pulse width shorter than that of the On writing pulse and a reset pulse having the same polarity as that of the On writing pulse, in this order before applying the On writing pulse to the cell.

10 Claims, 13 Drawing Sheets

(56) References Cited

U.S. PATENT DOCUMENTS

2014/0321196 A1* 10/2014 Ikeda ................. G11C 13/0064
　　　　　　　　　　　　　　　　　　　　　　　365/148

* cited by examiner

FIG. 9
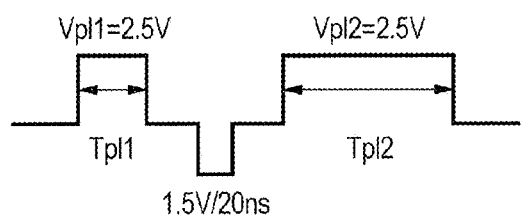
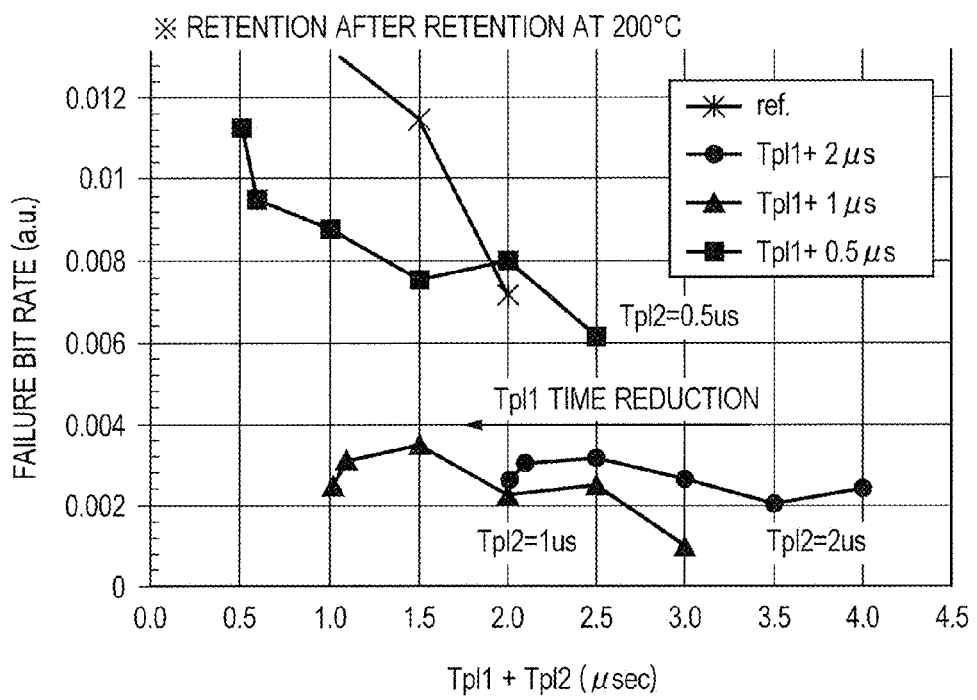

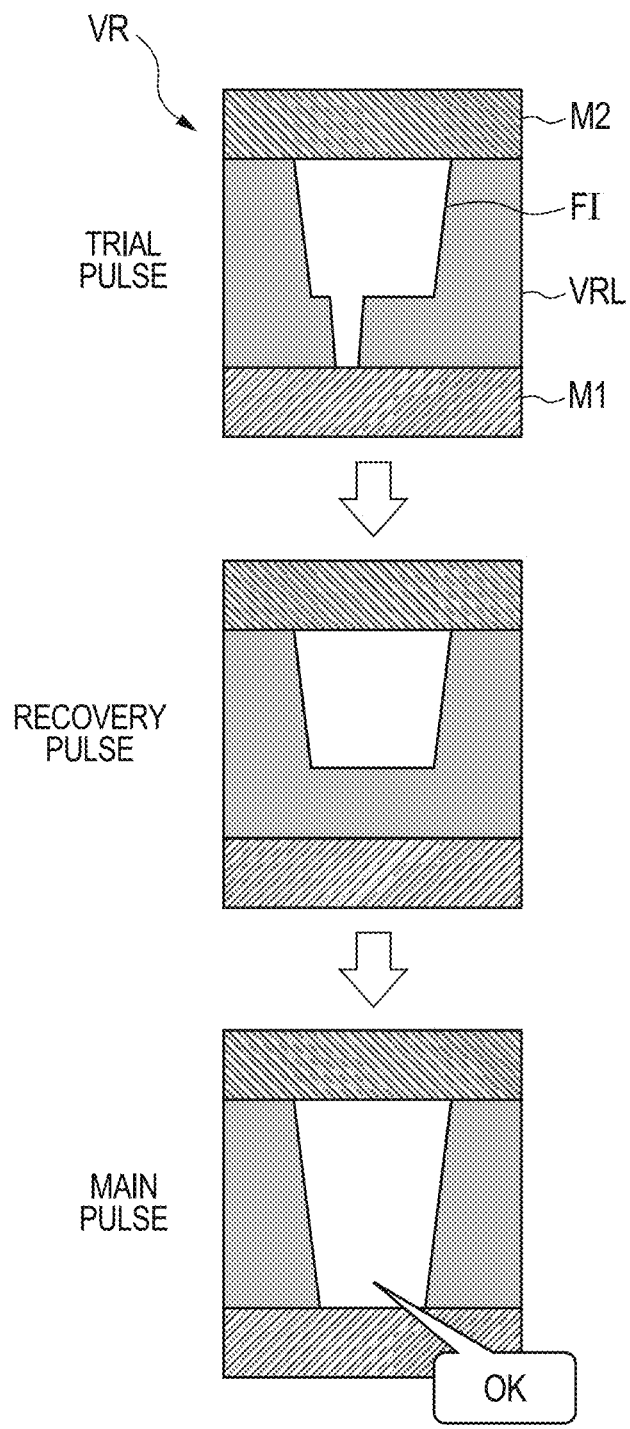

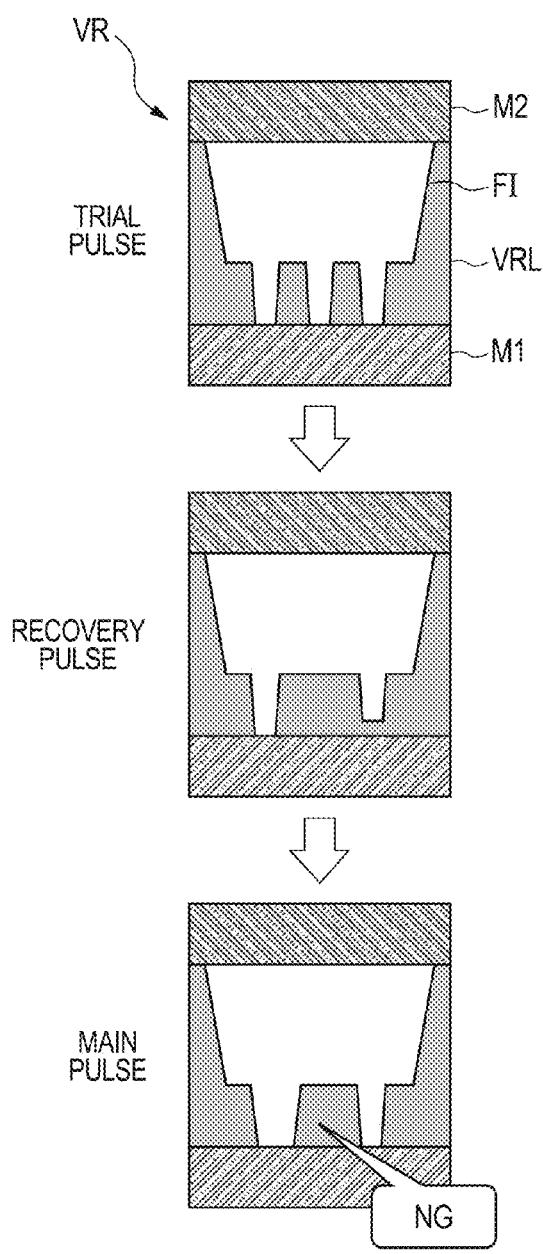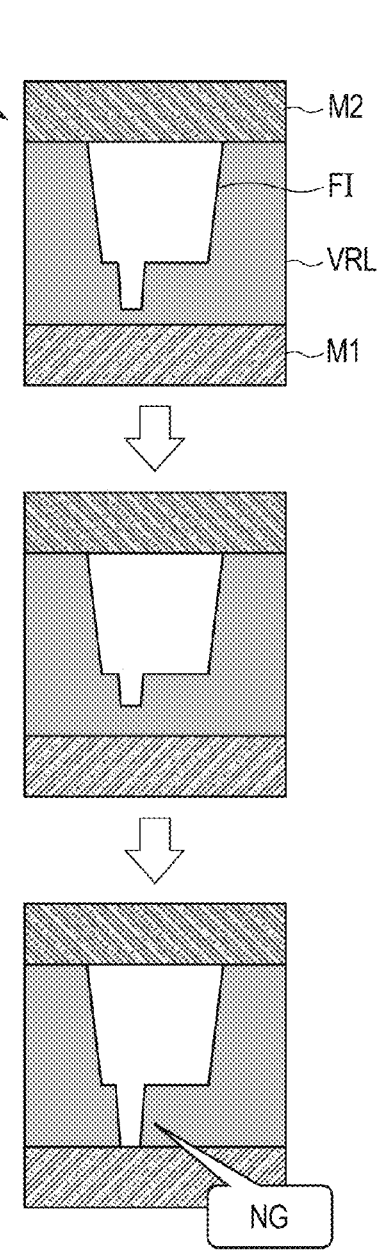

SEMICONDUCTOR MEMORY DEVICE INCLUDING A RESISTANCE CHANGE ELEMENT AND A CONTROL CIRCUIT FOR CHANGING RESISTANCE OF THE RESISTANCE CHANGE ELEMENT

CROSS-REFERENCE TO RELATED APPLICATIONS

The disclosure of Japanese Patent Application No. 2015-117585 filed on Jun. 10, 2015 including the specification, drawings and abstract is incorporated herein by reference in its entirety.

BACKGROUND

The present invention relates to a memory device, and, more particularly, to a technique applicable to a semiconductor memory device using a resistance change element.

One non-volatile memory is a resistance change memory (ReRAM) using a difference in a resistance value between a low-resistance state (On state) and a high-resistance state (Off state) in the resistance change element.

For example, the publication of Japanese Patent No. 4838399 describes a method for improving the stability, the reliability, and the memory retention characteristic of a writing operation in the ReRAM. The resistance change element has some characteristics. Specifically, the first resistance state is changed to the second resistance state, upon application of a first voltage pulse, and the second resistance state is changed to the first resistance state, upon application of a second voltage pulse having a polarity different from that of the first voltage. When to change from the first resistance state to the second resistance state, according to the described method, applied to the resistance change element are at least the first voltage pulse, a third voltage pulse whose voltage absolute value is smaller than that of the second voltage and having the same polarity as that of the second voltage, and the first voltage pulse, sequentially in this order.

The publication of Japanese Patent No. 5250726 describes a method including a weak writing step and subsequently a normal writing step, as steps for changing a resistance change element from the first resistance state to the second resistance state. In the weak writing step, a third voltage pulse having the same polarity as that of the first voltage and having a different absolute value is applied to the resistance change element, thereby causing it to be in the second resistance state. After this, a fourth voltage pulse having the same polarity as that of the second voltage and having the absolute value lower than that of the second voltage and the third voltage is applied, thereby causing it to be in an intermediate resistance state having a resistance value between the first resistance state and the second resistance state. In the normal writing step, the first voltage pulse is applied at least once to the resistance change element, thereby transiting from the intermediate resistance state to the second resistance state.

SUMMARY

To widen a memory window (a ratio of the On resistance as a resistance value of an On state and the Off resistance as a resistance value of an Off state) for improving the performance in the ReRAM, it is effective to increase the condition at the time of writing (Off writing) for the Off state (for example, to increase the amplitude of a pulse voltage to be applied at the Off writing, to increase the pulse width, and to increase the pulse current), and to increase the Off resistance for a high resistance. However, when the condition of the Off writing is excessively increased, there is a tendency of degrading the retention characteristic of the On state, when it is transited to the On state afterwards. That is, securing of the memory window and the retention characteristic of the On state are in the relationship of trade-off.

According to the technique described in the publication of Japanese Patent No. 4838399, for example, for the purpose of enhancing the stability of the resistance after the writing and for improving the verify success rate, before applying the first voltage pulse at the second time following the first voltage at the first time, the third voltage pulse having an opposite polarity thereto is applied. In this case, in consideration of the retention characteristic after the writing, it is necessary to elongate the first voltage pulse. As a result, a problem is that the writing time or writing energy may possibly be increased, because the elongated pulses are successively applied.

For example, according to the technique described in the publication of Japanese Patent No. 5250726, it is mainly assumed that the absolute value of the third voltage is lower than that of the first voltage, from the perspective of decreasing the consumption power, in the third voltage pulse to be applied in the weak writing step and the first voltage pulse having the same polarity and to be applied in the normal writing step. In this case, for example, at the time of decreasing the resistance (On writing), the probability/degree of being in a decreased resistance state (a state in which a filament is a conductive continuous filament in the resistance change element) decreases. This results in a problem of lowering the repairing function of the retention failure and a problem of not attaining a sufficient effect.

That is, an object of the present application is to improve the reliability of a semiconductor memory device. Any other objects and new features will be apparent from the following detailed description and the accompanying drawings.

According to one embodiment of the present invention, there is provided a semiconductor device including memory cells and a control circuit. Each of the memory cells includes a resistance change element. The control circuit can perform a first writing process for applying, to the memory cell, a first writing pulse for controlling a state of the memory cell to be in a first resistance state in which a resistance value of the resistance change element is lower than a first reference value and a first writing process for applying a second writing pulse with an opposite polarity to the first writing pulse for a second resistance state in which the value is a second reference value or greater. The control circuit applies, in the first writing process, a first pulse having a same polarity as that of the first writing pulse and having a pulse width shorter than that of the first writing pulse and a second pulse having a same polarity as that of the second writing pulse, sequentially in this order, before applying the first writing pulse to the memory cell.

According to the one embodiment, it is possible to improve the reliability of the semiconductor memory device. Particularly, in the semiconductor memory device including the resistance change element, the retention characteristic of the On state can be improved while securing the memory window.

BRIEF DESCRIPTION OF THE DRAWINGS

FIG. 9 is a diagram illustrating an example of the retention characteristics of the On state when the pulse width is changed between a trial pulse and the main pulse, in the On writing method in the embodiment 1 of the present invention.

FIG. 11 is a diagram schematically illustrating an example of an operation and an effect of a resistance change element in the embodiment 2 of the present invention.

FIGS. 12A and 12B are diagrams schematically illustrating examples of operations and effects of the resistance change element, in the case where a change is made in the condition of the trial pulse in the embodiment 2 of the present invention.

DETAILED DESCRIPTION

Descriptions will now specifically be made to embodiments of the present invention. In the entire illustrations for describing the embodiments, substantially the same elements are identified by the same reference signs, and will not repeatedly be described.

As described above, in the writing for the ReRAM, securing of a memory window and a retention characteristic of an On state are in the relationship of trade-off. The inventors of the present application have found that it is possible to improve the retention characteristic of the On state, while securing the memory window. That is, in a sequence for this improvement, at the time of On writing, after applying a short On pulse at the first time, there is applied a pulse having the same polarity (that is, the opposite polarity to the On pulse) as the pulse at the time of Off writing and having the low absolute value, thereafter applying a long On pulse.

In preferred embodiments as will be described below, the above-described sequence is followed, at the time of the On writing for the resistance change type memory having the resistance change element as a non-volatile memory, especially for a bipolar type ReRAM in which pulses with polarities are applied differently between the low resistance writing (On writing) and the high resistance writing (Off writing). By so doing, it is possible to improve the retention characteristic of the On state and to improve the performance of the ReRAM, while securing the memory window.

Embodiment 1

Figure 1:
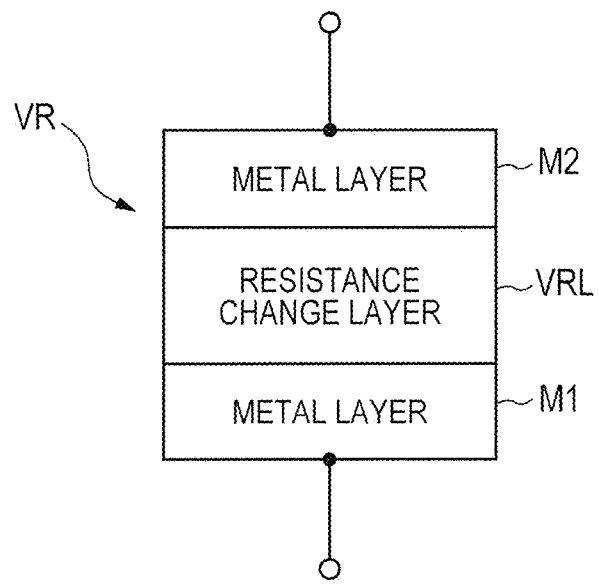
FIG. 1 is a diagram schematically illustrating a configuration example of a resistance change element for use in a bipolar ReRAM.

FIG. 1 is a diagram schematically illustrating a configuration example of a resistance change element for use in the bipolar type ReRAM. A resistance change element VR has a configuration in which a resistance change layer VRL is sandwiched between a metal layer M1 and a metal layer M2. The metal layer M1 and the metal layer M2 respectively form a first electrode and a second electrode. The resistance change layer VRL can be changed into a low resistance state (On state), by applying a positive voltage to the metal layer M2 as compared with that of the metal layer M1, and the resistance change layer VRL can be changed into a high resistance state (Off state) by applying a positive voltage to the metal layer M1 as compared with that of the metal layer M2. The On state and the Off state correspond respectively to "0" and "1" or "1" and "0", thereby storing information of one bit.

The resistance change layer VRL is formed, for example, of metal oxide (for example, tantalum oxide, titanium oxide, zirconium oxide, or hafnium oxide). In this case, the resistance change layer VRL may be a single layer film or a laminated film. When the resistance change layer VRL is a laminated film, it may be a laminated film with, for example, different combinations of kinds of elements, or may be a laminated film with the same combination of kinds of elements. In this case, the layers of the laminated film have different oxygen composition ratios. The resistance change layer VRL has a thickness of, for example, 1.5 nm to 30 nm. The metal layer M1 and the metal layer M2 are formed of, for example, ruthenium, titanium nitride, tantalum, tantalum nitride, tungsten, palladium, or platinum.

Figure 2:
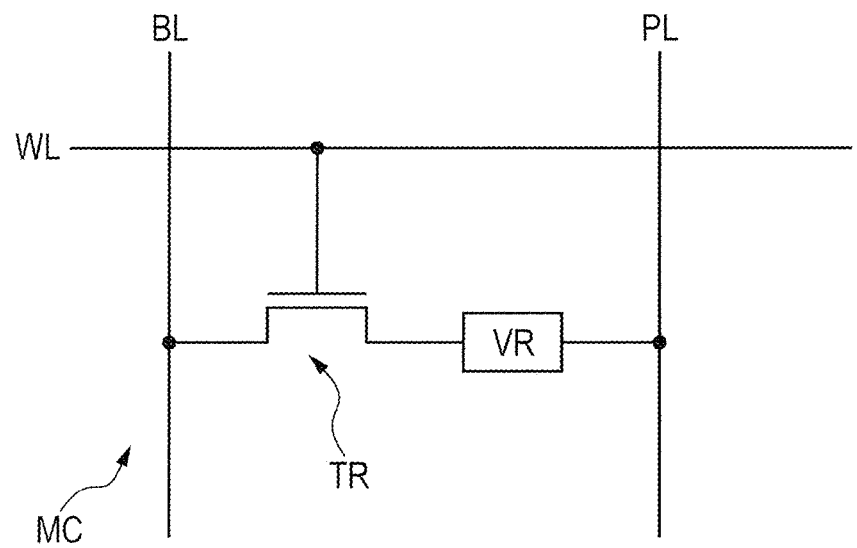
FIG. 2 is a diagram schematically illustrating a configuration example of a memory cell.

FIG. 2 is a diagram schematically illustrating a configuration example of a memory cell in the ReRAM. A memory cell MC can be configured with a combination of a resistance change element VR illustrated in FIG. 1 and a selection transistor TR including a MOS (Metal-Oxide Semiconductor) transistor. The selection transistor TR is a selection transistor for controlling whether to apply, to the resistance change element VRL, or interrupt a potential difference between a bit line BL and a plate line PL.

One end of the resistance change element VR is coupled to the plate line PL, while the other end thereof is coupled to the bit line BL through the selection transistor TR. The gate of the selection transistor TR is coupled to a word line WL. Either one of the potential of the bit line BL and the potential of the plate line is made greater than the other, thereby enabling to change the voltage polarity to be applied to the resistance change element VR.

Though there is no particular limitation that either one of the metal layer M1 and the metal layer M2 is coupled to the bit line BL, it is assumed that the metal layer M1 is coupled to the bit line BL in the descriptions below. Though there is no particular limitation that the selection transistor TR is of either the N-channel type or the P-channel type, it is assumed that the transistor is of the N-channel type in which the source and the drain are electrically conducted with each other by applying a positive voltage to the gate, in the descriptions below. If it is of the P-channel type, the source and the drain are electrically conducted with each other by applying a negative voltage to the gate.

Figure 3:
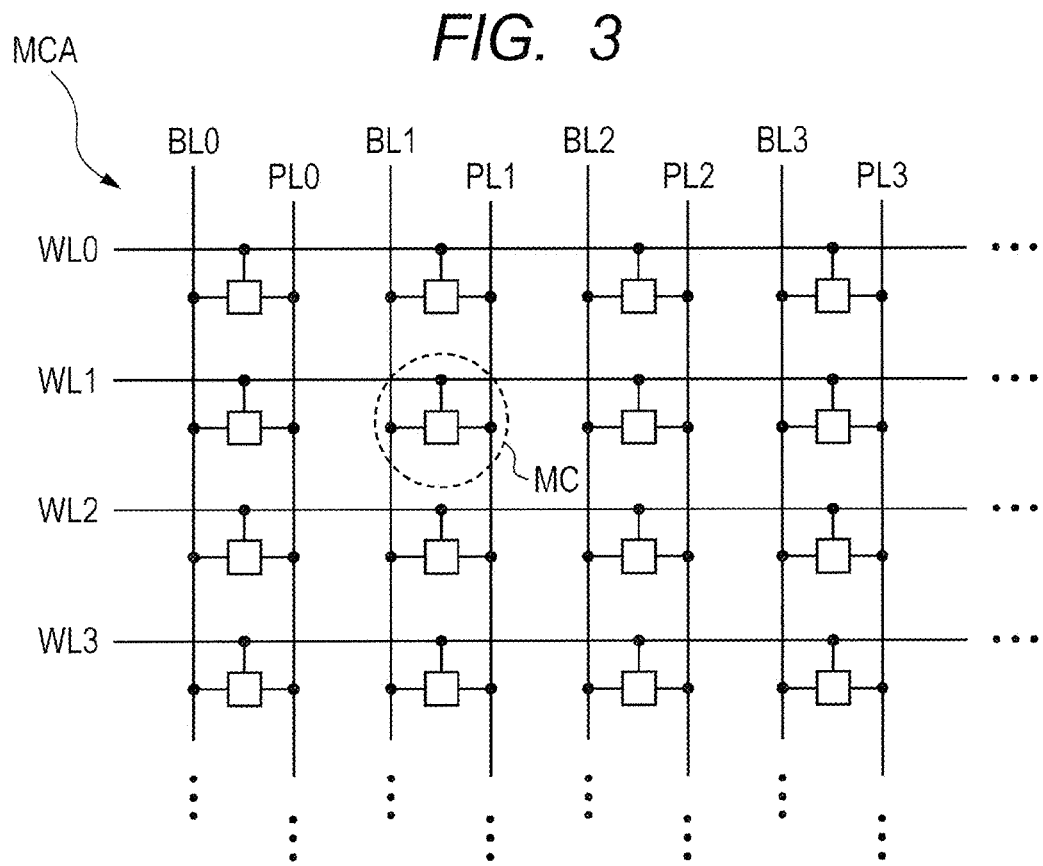
FIG. 3 is a diagram schematically illustrating a configuration example of a memory cell array in the ReRAM.

FIG. 3 is a diagram schematically illustrating a configuration example of a memory cell array in the ReRAM. A memory cell array MCA can be configured by arranging the memory cells of FIG. 2 in matrix. In the example of the memory cell array MCA illustrated in FIG. 3, the configuration has a memory capacity of 16 bits in a matrix of 4 rows and 4 columns. If the rows or columns of the array is appropriately increased, a larger memory capacity can be realized.

The memory cells MC are coupled respectively at the intersection points of the word lines WL0 to WL3, the bit lines BL0 to BL3, and the plate lines PL0 to PL3. The entire word lines WL0 to WL3, the bit lines BL0 to BL3, and the plate lines PL0 to PL3 are coupled to a non-illustrative control circuit at the peripheral part of the memory cell array MCA. For example, the word lines WL0 to WL3 are coupled to a non-illustrative word line control circuit in the memory cell array MCA on the left side of the illustration. The bit lines BL0 to BL3 are coupled to a non-illustrative bit line control circuit on the upper stage of the illustration. Similarly, the plate lines PL0 to PL3 are coupled to a non-illustrative plate line control circuit on the upper stage of the illustration.

Each of the control circuits performs writing, by applying a voltage appropriately to the word lines WL, the bit lines BL, and the plate lines PL, to control a desired memory cell MC to be in a high resistance state or a low resistance state. Alternatively, reading is performed upon detection of a current flowing to the bit line BL or the plate line PL, based on a determination as to whether a desired memory cell MC is in a high resistance state or a low resistance state.

For example, for the writing for controlling the memory cell MC (enclosed with a dotted-line circle) to be in the On state, the word line WL1 and the plate line PL1 may be at a high potential. In addition, other word lines WL0, WL2, and WL3, and the plate lines PL0, PL2, and PL3, and the entire bit lines BL0 to BL3 may be at zero potential. On the contrary, for the writing for controlling the memory cell MC enclosed with a dotted-line circle to be in the Off state, the word line WL1 and the bit line BL1 may be at a high potential. In addition, other word lines WL0, WL2, and WL3, the bit lines BL0, BL2, and BL3, and the entire plate lines PL0 to PL3 may be at zero potential.

To read whether the memory cell MC enclosed with the dotted-line circle is in the On state or the Off state, the word lines WL0, WL2, and WL3, and the plate lines PL0, PL2, and PL3 (excluding the word line WL1 and the plate line PL1), and the entire bit lines BL0 to BL3 may be at zero potential, while the word line WL1 may be at a high potential. Then, the current flowing to the bit line BL1 or the plate line PL1 may be detected, by applying a voltage sufficiently lower than that at the writing to the plate line PL1.

According to the above operation, in the memory cell MC coupled to those except the word line WL1, no voltage is applied to the resistance change element VR, because the selection transistor TR is non-conductive. In the memory cell MC coupled to those except the bit line BL1 and the plate line PL1, no voltage is applied to the resistance change element VR, because the bit lines BL0, BL2, BL3, and the plate lines PL0, PL2, PL3 are at the same potential. Thus, the writing or reading is performed only for the memory cell MC enclosed with a dotted-line circle. The same applies to writing or reading for any other memory cells MC.

Figure 4:
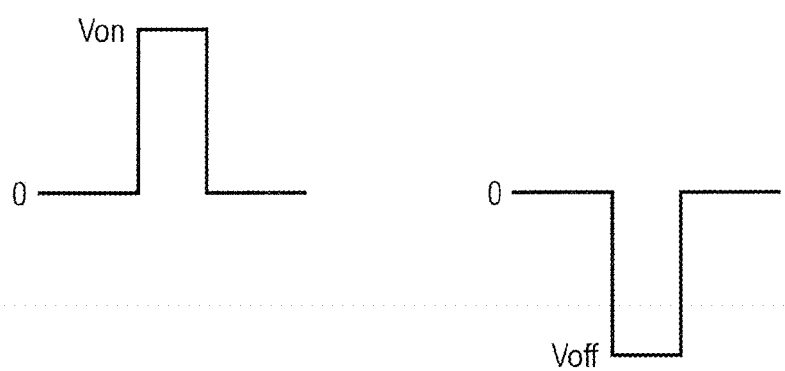
FIG. 4 is a diagram illustrating waveform examples of normal applied voltages at the time of performing the writing for the On state of the memory cell and performing the writing for the Off state thereof.

FIG. 4 is a diagram illustrating waveform examples of normal applied voltages at the time of performing the writing for the memory cell MC to be in the On state and the writing for the memory cell to be in the Off state. For the resistance change element VR of the memory cell illustrated in FIG. 2 to be in the low resistance state (On state), a high voltage greater than that on the side of the bit line BL is applied to the side of the plate line PL of the resistance change element VR. Normally, this voltage with a pulse form is applied once, as illustrated on the left of FIG. 4. To do this, for example, after the potential of the plate line PL is made greater than the potential of the bit line BL (in the example of FIG. 4, the PL side is set to Von, and the BL side is at zero potential), the potential of the word line WL may be increased, and the selection transistor TR may be made conductive, for a predetermined period of time. Alternatively, in a state where the potential of the word line WL is increased, and the selection transistor TR is made conductive, a pulse voltage for causing the plate line PL side to be at a positive potential may be applied between the plate line PL and the bit line BL.

On the contrary, for the resistance change element VR to be in the high resistance state (Off state), a high voltage greater than that on the side of the plate line PL is applied once to the side of the bit line BL of the resistance change element VR, in the pulse form as illustrated on the right side of FIG. 4 (illustrated as a reverse pulse, because the voltage to be applied has a polarity opposite to the pulse for the On state). To do this, for example, after the potential of the bit line BL side is made greater than the potential of the plate line PL (in the example of FIG. 4, the side of the bit line BL is set to Voff, and the side of the plate line PL is at zero potential), the potential of the word line WL may be increased, and the selection transistor TR may be conductive, for a predetermined period of time. Alternatively, in a state where the potential of the word line WL is increased, and the selection transistor TR is made conductive, a pulse voltage for causing the bit line BL side to be at a positive potential may be applied between the bit line BL and the word line PL.

Figure 5:
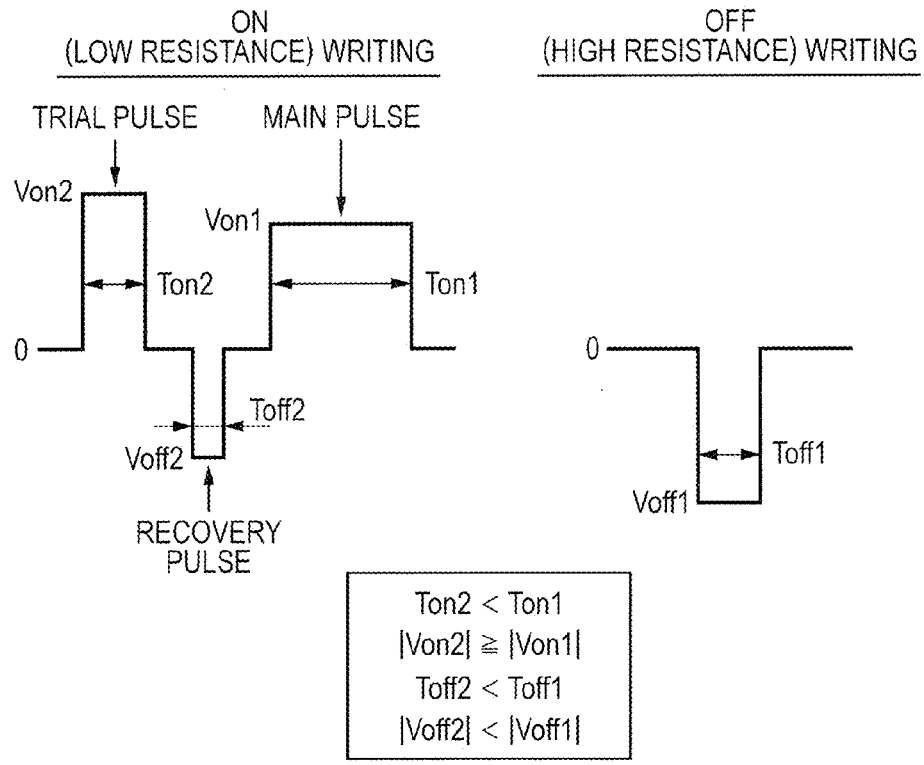
FIG. 5 is a diagram illustrating waveform examples of applied voltages at the time of performing the writing for the On state of the memory cell and performing the writing for the Off state thereof, in an embodiment 1 of the present invention.

FIG. 5 is a diagram illustrating waveform examples of applied voltages at the time of performing the writing for the memory cell MC in the embodiment 1 to be in the On state and the writing for the Off state. In the example of FIG. 5, the waveform example of the applied voltage for "Off writing" on the right side is the same as the normal case illustrated in FIG. 4. In the example of FIG. 5, the normal applied voltage at the "Off writing" is denoted by "Voff1", and the applied time is denoted by "Toff1".

In the example of the applied waveform for "On writing" on the left side, the sequence that differs from that illustrated in FIG. 4 is followed. Specifically, before applying a normal On writing pulse (hereinafter referred to as "main pulse"), an On pulse (hereinafter referred to as "trial pulse") with the same polarity as that of the main pulse and with a short pulse width is applied. After this, a pulse (hereinafter referred to as "recovery pulse" or "reset pulse") with a polarity opposite to that of the On pulse is applied.

An applied time (pulse width) Ton2 of the trial pulse in the illustration is shorter than an applied time Ton1 of the main pulse. That is, a relationship of Ton2<Ton1 is satisfied. The applied voltage Von2 of the trial pulse is equal to or greater than the applied voltage Von 1 of the main pulse. That is, a relationship of |Von2|≥|Von1| is satisfied. Further, the applied time Toff2 of the reset pulse is shorter than the applied time Toff1 of the normal Off writing pulse on the right side of the illustration. That is, a relationship of Toff2<Toff1 is satisfied. The applied voltage Voff2 of the reset pulse is lower than the applied voltage Voff1 of the normal Off writing pulse. That is, a relationship of |Voff2|<|Voff1| is satisfied.

Figure 6:
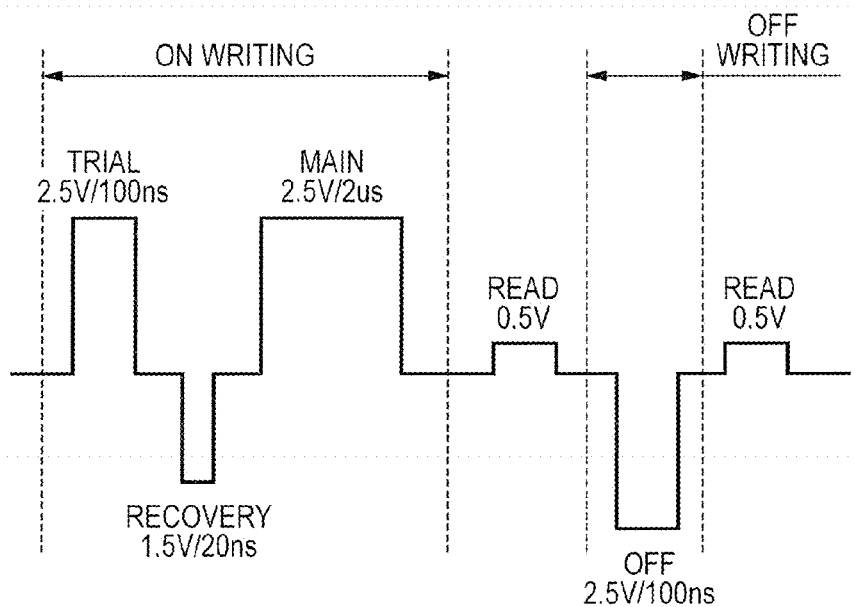
FIG. 6 is a diagram illustrating a concrete example of writing/reading sequences in the embodiment 1 of the present invention.

FIG. 6 is a diagram illustrating a concrete example of writing/reading sequences in the embodiment 1. In this case, in the On writing sequence, before applying the main pulse of 2.5V/2 us, a short trial pulse with the same polarity as the main pulse and with a pulse width of 100 ns is applied, and further a reset pulse (recovery pulse) of 1.5V/20 ns having a polarity opposite to that of the main pulse is applied. The Off writing pulse is 2.5V/100 ns, and the applied voltage of the read pulse is 0.5V.

Figure 7:
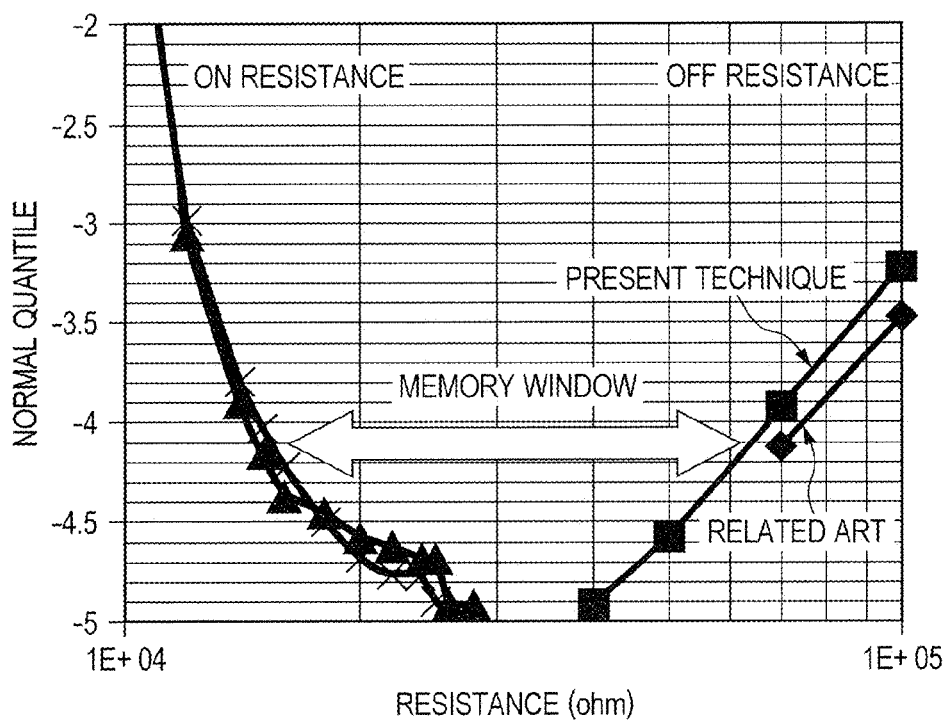
FIG. 7 is a diagram illustrating an example of distribution states of On resistance and Off resistance, in the case of the On writing method in the embodiment 1 of the present invention and in the case of the related art method.

FIG. 7 is a diagram illustrating an example of distribution states of On resistance and Off resistance, in the case of the On writing method in this embodiment and in the case of the related art method. This shows the cumulative frequency distribution of the On resistance value and the Off resistance value evaluated using the 2 Mb memory cell array, for the On writing sequence of FIG. 6 and the On writing by applying only the main pulse in accordance with the related art method. As illustrated, even when the On writing sequence of this embodiment is followed, mostly the same resistance distribution as that of the related art method can be attained. That is, the similar (ratio of the On resistance and the Off resistance) memory window can be attained.

Figure 8:
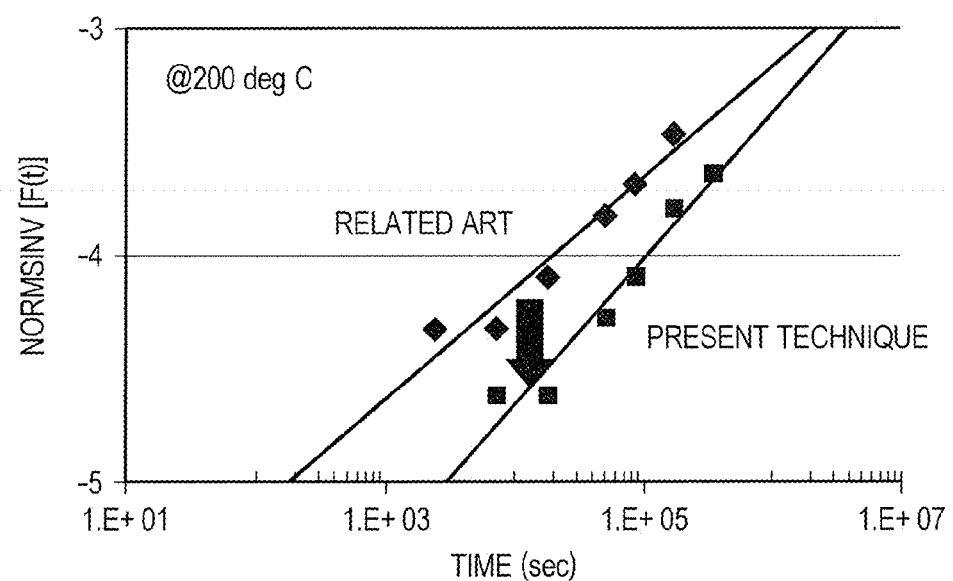
FIG. 8 is a diagram illustrating an example of the retention characteristics of the On state, in the case of the On writing method in the embodiment 1 of the present invention and in the case of the related art method.

FIG. 8 is a diagram illustrating an example of the retention characteristic of the On state, in the case of the On writing method in this embodiment and in the case of the related art method. This shows the time dependency of retention failure at 200° C. in the On state evaluated using the 2 Mb memory cell array, for the On writing sequence illustrated in FIG. 6 and the On writing for applying only the main pulse using the related art method. Note that any of those bits whose On resistance has exceeded 30 kΩ is referred to as a "retention failure bit". It is understood from FIG. 8 that the retention characteristic of the On state is improved using the On writing method of this embodiment. That is, in consideration with the contents of FIG. 7, it is understood that the retention characteristic of the On state is improved without having an effect on the memory window, using the On writing method of this embodiment.

FIG. 9 is a diagram illustrating an example of the retention characteristic of the On state, when a change is made in the pulse width of the trial pulse and the main pulse in the On writing method of this embodiment. This shows, in the graph of the lower stage, the retention failure bit rate at 200° C. in the On state evaluated using the 2 Mb memory cell array, when a change is made in the sum (Tpl1+Tpl2) of the trial pulse width (Tpl1) and the main pulse width (Tpl2), in the On writing sequence illustrated in the graph in the upper stage. Like the above-described case of FIG. 8, any of those bits whose On resistance has exceeded 30 kΩ is referred to as a "retention failure bit".

In FIG. 9, the main pulse width Tpl2 has three kinds of widths of 0.5 us, 1.0 us, and 2.0 us. It illustrates the Tpl1 dependency of the retention failure bit rate, when the Tpl1 as the trial pulse width is changed in association therewith. It also illustrates the retention failure bit rate for the pulse width (Tpl1), when only the main pulse as reference (ref.) is applied.

From FIG. 9, it is understood that, for the Tpl1 dependency, the retention failure bit rate in the On state increases, if the main pulse is shortened up to 0.5 us, and the retention failure bit rate in the On state does not increase, even if the time is shortened, up until the Tpl2 is 1.0 us. It is also understood that, up until the Tpl2 is approximately 1.0 us, the Tpl2 dependency of the retention failure bit rate is very small (the retention failure bit rate does not really change, even if the Tpl1 changes), and the Tpl1 can be shortened up to 10 ns.

In comparison with the reference (ref.) of the related art method, the retention failure bit rate increases, if the Tpl2 is shortened in the reference (for example, it exceeds 0.01, if shortened up to 1.5 us). On the other hand, in the On writing of this embodiment, if the Tpl2 of the main pulse is shortened up to 1 us, the retention failure bit rate in the On state can be suppressed in a range approximately from 0.002 to 0.003. That is, as compared with the related art method in which the single main pulse (On writing pulse) is applied, the retention failure bit rate can be reduced with a short pulse width, thus reducing the energy required for the On writing.

As described above, in the ReRAM of the embodiment 1, the above-described On writing sequence is followed, thereby enabling to improve the retention characteristic of the On state without having an effect on the memory window. It is possible to reduce the energy required for the On writing as compared with the related art method in which the single main pulse (On writing pulse) is applied, that is, to perform the On writing with low consumption power.

Embodiment 2

Figure 10:
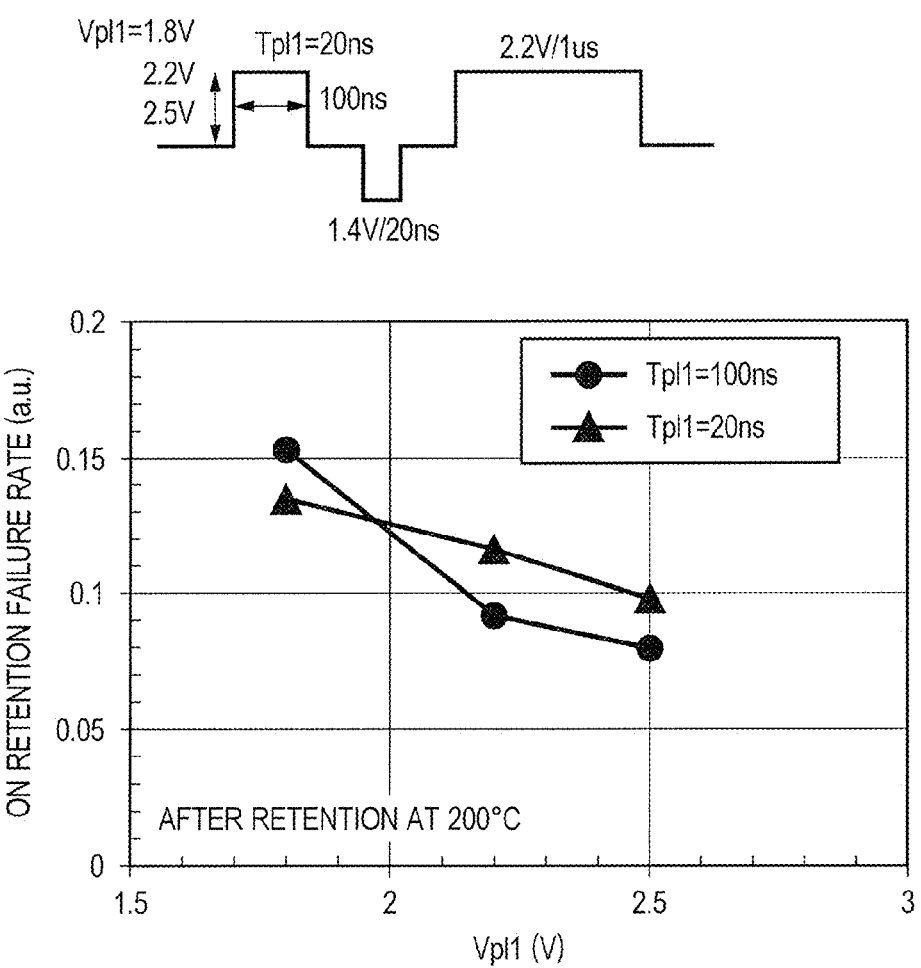
FIG. 10 is a diagram illustrating an example of the retention characteristics of the On state, when a change is made in the voltage of a trial pulse in the On writing method in an embodiment 2 of the present invention.

In this embodiment, in the On writing sequence in the ReRAM of the above-descried embodiment 1, an applied voltage (Vpl1)) of the trial pulse is optimized. FIG. 10 is a diagram illustrating an example of the retention characteristic of the On state, when a change is made in the voltage of the trial pulse in the On writing method of this embodiment. In this case, the trial pulse width Tpl1 has two kinds of widths of 20 ns and 100 ns. It illustrates the Vpl1 dependency of the retention failure bit rate at 200° C. in the On state evaluated using the 2 Mb memory cell array, when the voltage (Vpl1) of the trial pulse is changed to 1.8V, 2.2V, and 2.5V in association therewith. Like the above-described cases of FIG. 8 and FIG. 9, any of those bits whose On resistance has exceeded 30 kΩ is referred to as a "retention failure bit".

As illustrated in FIG. 10, in both cases that the Tpl1 is 20 ns and 100 ns, the retention failure bit rate in the On state decreases, as the value of the Vpl1 is high. It is also understood that the retention characteristic has been improved. Thus, as described in the embodiment 1, it is desirable that the trial pulse be shorter in width (time) than the main pulse and be a high voltage pulse.

As described above, in the On writing sequence of this embodiment, the retention characteristic of the On state is improved, by adding the trial pulse and the reset pulse before the main pulse. Thus, it is obvious that this pulse sequence has the effect of suppressing the retention failure in the On state. A consideration will hereinafter be given on the reason why the trial pulse is preferably a high voltage pulse.

FIG. 11 is a diagram schematically illustrating an example of an operation and an effect of a resistance change element VR in the embodiment 2. In the illustration, in the configuration of the resistance change element VR illustrated in FIG. 1, what are illustrated are examples of the state of a conductive filament FI formed in a resistance change layer VRL from top to bottom, sequentially in the case of applying the trial pulse, the reset pulse, and the main pulse.

The conductive filament FI is formed in a state where defects (oxygen vacancy (Vo)) with deficient oxygen are concentrated with a high density. In a state where a metal layer M1 and a metal layer M2 are coupled with each other in the conductive filament FI (for example, the state of the upper stage and the lower stage of FIG. 11), the resistance change element VR is in a low resistance state (On state). In a state where the metal layer M1 and the metal layer M2 are not completely coupled with each other in the conductive filament FI (i.e. a gap exists therebetween) (for example, the state of the middle stage of FIG. 11), the resistance change element VR is in a high resistance state.

Like the related art method, if the normal main pulse is applied only once in the On writing, the conductive filament FI is very thin as illustrated in the upper stage of FIG. 11, or is in a state where the density of oxygen vacancy is very low, and the retention characteristic of the On state may be an undesirable state (retention failure).

In this embodiment, a reset pulse with an opposite polarity is applied once to make a high resistance state, in a state right after the conductive filament FI is continuous as illustrated in the upper stage of FIG. 11 upon application of the trial pulse. Then, at the time of applying the main pulse thereafter, an electric field with the main pulse is concentrically applied to a high resistance unit (the gap part of the conductive filament FI). As a result of this, as illustrated in the lower stage of FIG. 11, it can be considered that the conductive filament FI with a large diameter or a high density of oxygen vacancy is formed. Then, the retention characteristic of the On state can be improved with this conductive filament FI formed in this good state (high density).

FIG. 12 are diagrams schematically illustrating examples of operations and effects of a resistance change element VR, in a case where a change is made in the condition of the trial pulse. FIG. 12A illustrates an example when the pulse width of the trial pulse is elongated. In this case, as illustrated in the upper stage of FIG. 12A, even in the case of the conductive filament FI formed in a bad state (low density) likely to cause a retention failure in the On state, the pulse width of the trial pulse is elongated, and it is applied for a long period of time. This results in that the conductive filament FI grows up in a horizontal direction (that is, in a direction orthogonal to the relative direction of the metal layer M1 and the metal layer M2).

Even if the reset pulse is applied thereafter, the conductive filament FI is likely to be maintained without being completely disconnected, as illustrated in the middle stage of FIG. 12A. In this case, even if the main pulse is applied thereafter, an electric field is not sufficiently generated in the high resistance unit. Thus, as illustrated in the lower stage of FIG. 12A, it can be considered that the thin or low-density conductive filament FI is easily formed.

FIG. 12B illustrates an example of a case where the trial pulse is a low voltage pulse. As illustrated in the upper stage of FIG. 12B, it decreases the probability that the conductive filament FI is in a continuous state, after application of the trial pulse. That is, there exist many bits in a high resistance state (Off state) in which the conductive filament FI is not in a continuous state even after application of the trial pulse.

According to the point of the On writing sequence of this embodiment, a reset pulse is applied right after the conductive filament FI is in a continuous state, thereby causing a current to flow to the conductive filament FI, and the conductive filament FI is in a discontinuous state by a reaction of the oxygen and the oxygen vacancy due to Joule heat, to once form a high resistance state. As a result, as illustrated in the upper stage of FIG. 12B, even if a reset pulse is applied in a state where the conductive filament FI is in the discontinuous state, only the effect based on the generation of the electric field is attained, because no current flows. As illustrated in the middle stage of FIG. 12B, the conductive filament FI is not really changed from the state of the upper stage. Therefore, it is not possible to attain the effect by resetting once into the high resistance state, as illustrated in FIG. 11.

Thus, even if the main pulse is applied thereafter, as illustrated in the lower stage of FIG. 12B, it is considered that there is high probability of forming a thin or low-density conductive filament FI, as illustrated in the lower stage of FIG. 12B. Accordingly, in the On writing sequence of this embodiment, the trial pulse is desirably shorter in pulse width (short time) than the main pulse, and is desirably a higher voltage pulse than the main pulse.

As described above, in the ReRAM of the embodiment 2, in the above-described On writing sequence, the trial pulse is shorter in pulse width than that of the main pulse, and is a higher voltage pulse than the main pulse. As a result, enlargement (enlarged in a horizontal direction) of the conductive filament FI is suppressed, after application of the trial pulse. It is possible to improve the continuous probability of the conductive filament FI, and to further improve the retention characteristic by effectively repairing a factor of causing a retention failure of the On state.

Embodiment 3

Figure 13:
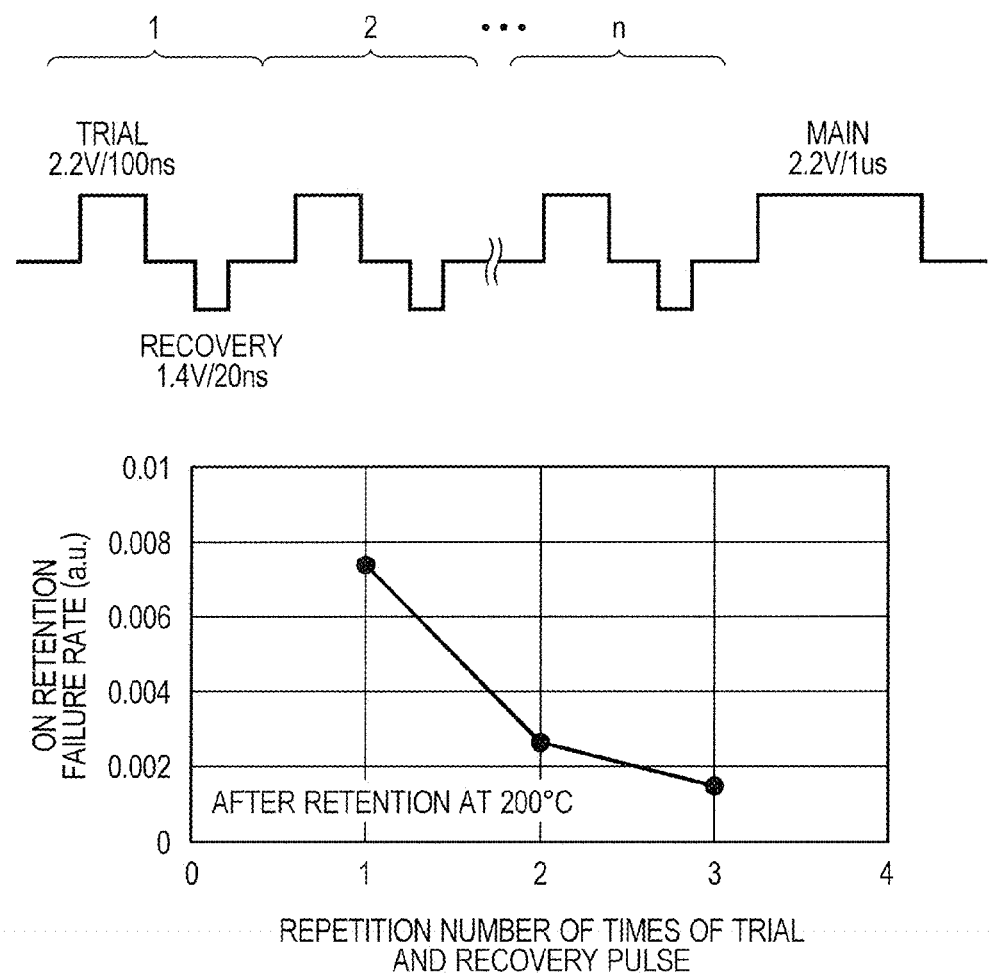
FIG. 13 is a diagram illustrating examples of a sequence of an On writing method and an example of the retention characteristic of the On state, when a change is made in the number of repetition times of a trial pulse and a reset pulse, in the On writing method in an embodiment 3 of the present invention.

FIG. 13 is a diagram illustrating an example of a sequence of an On writing method of an embodiment 3 and a retention characteristic of an On state when a change is made in the number of repetition times of a trial pulse and a reset pulse. As illustrated in the upper stage of FIG. 13, in this embodiment, a set of the trial pulse and the reset pulse are applied repeatedly for an n-number of times (n≥2), and the main pulse is applied thereafter, as a modification of the On writing sequence described in the embodiments 1 and 2.

The lower stage of FIG. 13 illustrates the dependency of the number of repetition times of the retention failure rate at 200° C. in the On state, when a change is made in the number of repetition times at the application of the set of the trial pulse and the reset pulse in the above-described sequence. It is understood that the retention failure rate in the On state decreases, as the number of repetition times increases at the application of the set of the trial pulse and the reset pulse.

As described above, in the ReRAM of the embodiment 3, in the On writing sequence described in the embodiments 1 and 2, it is possible to improve the retention characteristic of the On state, by applying the set of the trial pulse and the reset pulse repeatedly for a plurality of number of times.

Embodiment 4

Figure 14:
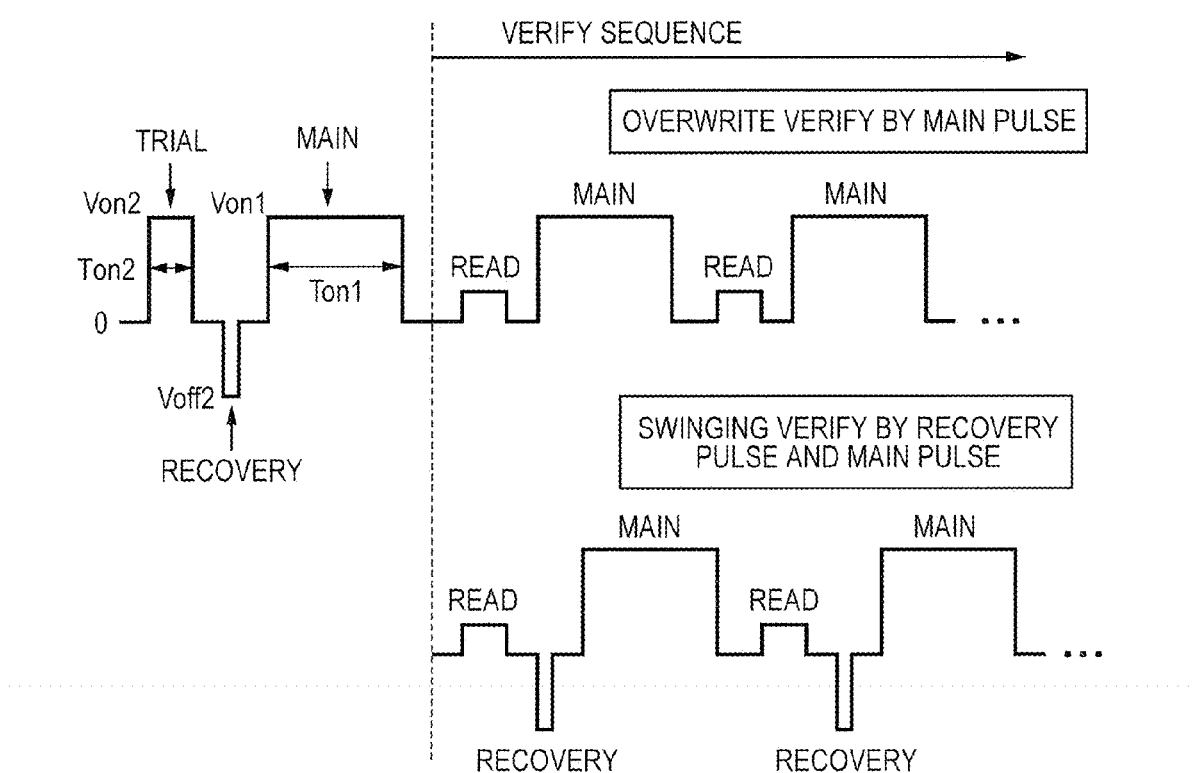
FIG. 14 is a diagram illustrating an example of a sequence in the On writing method in an embodiment 4 of the present invention.

FIG. 14 is a diagram illustrating an example of an On writing sequence in an embodiment 4. In this embodiment, so-called verify writing is combined with the On writing sequence described in the embodiments 1 to 3. That is, after performing the On writing in accordance with the On writing sequence illustrated in the embodiments 1 to 3, a check is made as to whether writing has desirably been performed upon application of a read pulse. Additional writing is performed for any bit (low resistance bit) for which the writing has not been succeeded, thereby improving the writing success rate.

The sequence at the time of performing the verifying is not particularly limited, and various verifying methods appropriately may be used. For example, though not illustrated, after the writing state is verified upon application of the read pulse, the On writing sequence illustrated in the embodiments 1 to 3 is performed, that is, a set of a trial pulse and a reset pulse are applied for an "n-number" (n≥1) of times. After this, the overwrite verifying for performing additional writing in accordance with the sequence for applying the main pulse is repeatedly performed until the writing is succeeded or until reaching a predetermined number of times. Alternatively, after the writing state is verified upon application of the read pulse, some verifying process is repeatedly performed. Specifically, the repeated process is overwrite verifying for performing the additional writing upon application of only the main pulse or the "swinging" verifying for applying the set of the reset pulse and the main pulse, as illustrated in the upper stage of FIG. 14.

As described above, in the ReRAM of the embodiment 4, by combining the verifying writing with the On writing sequence described in the embodiment 1 to 3, the success rate of the On writing can be improved. As compared with the overwrite verifying with only the main pulse illustrated in the upper stage of FIG. 14, it can simply be expected that the "swinging" verifying with the reset pulse and the main pulse as illustrated in the lower stage of FIG. 14 attains an improvement effect of the retention characteristic by stabilization of the On state based on the reset effect of the conductive filament FI.

Embodiment 5

Figure 15:
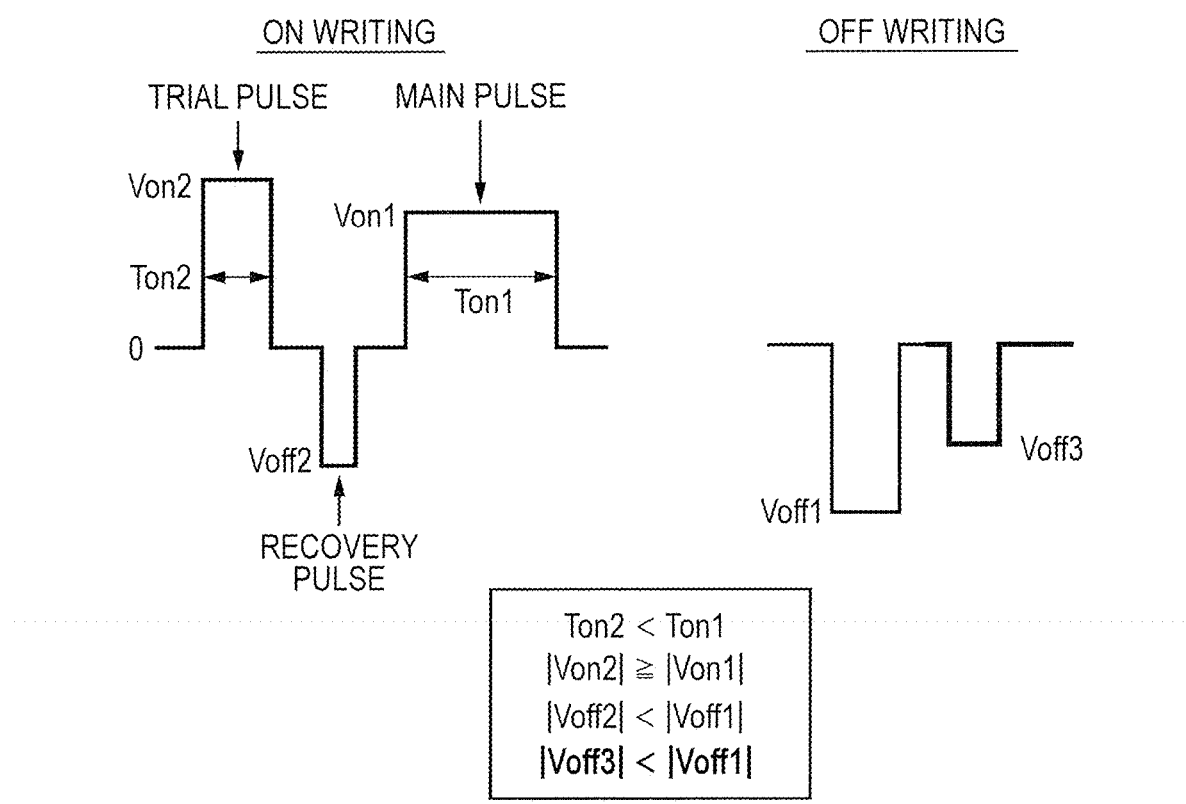
FIG. 15 is a diagram illustrating waveform examples of applied voltages at the time of performing ON writing and at the time of performing OFF writing, in an embodiment 5 of the present invention.

FIG. 15 is a diagram illustrating waveform examples of applied voltages at the time of performing the On writing and the Off writing in an embodiment 5. In the examples of FIG. 15, the example of the On writing sequence on the left side is the same as that illustrated in FIG. 5 of the embodiment 1. In this embodiment, in the Off writing on the right side, an Off state stabilizing pulse is further applied, after applying the normal Off writing pulse in FIG. 5. In this case, let it be assumed that an applied voltage Voff3 of the Off state stabilizing pulse is lower than the applied voltage Voff1 in the normal Off writing pulse. That is, a relationship of |Voff3|≤|Voff1| is satisfied.

By applying the Off state stabilizing pulse (weak Off pulse) after applying the normal Off writing pulse, the Off state after the writing is stabilized. By performing the On writing sequence illustrated in the embodiments 1 to 4 for the stabilized Off state, the On writing can effectively be performed, and it is possible to improve the retention characteristic of the On state. As illustrated in FIG. 15, the Off state stabilizing pulse may be applied right after applying the normal Off writing pulse. Alternatively, it may be applied right before performing the On writing sequence illustrated in the embodiments 1 to 4, after applying the normal writing pulse.

As described above, in the ReRAM of the embodiment 5, the Off state stabilizing pulse is applied after the Off writing until the next On writing, thereby forming the stabilized Off state. By performing the On writing sequence described in the above-described embodiments 1 to 4 for the stabilized Off state, the On writing can effectively be performed, and it is possible to improve the retention characteristic of the On state.

Embodiment 6

In this embodiment, descriptions will now be made to an example of an element configuration of a resistance change element which VR can attain a large effect at the time of applying the On writing sequence described in the above-described embodiments 1 to 5. The On writing method described in the embodiments 1 to 5 relates to a writing technique for enhancing the stability of the On state. Thus, it is possible to attain a remarkable effect, when it is applied to the resistance change element VR having a configuration in which the On state is easily unstabilized, in other words, a configuration in which the Off state is easily stabilized relatively compared with the On state.

Figure 16:
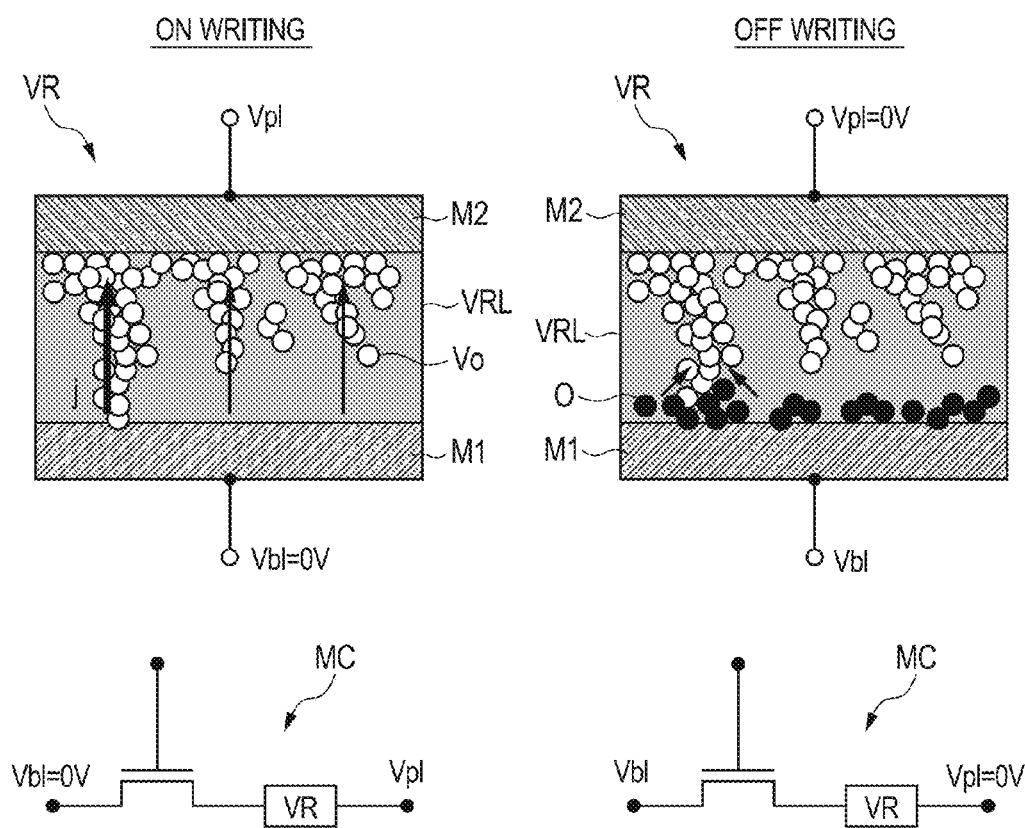
FIG. 16 is a diagram schematically illustrating an example of a configuration and an operation of a resistance change element in an embodiment 6 of the present invention.

FIG. 16 is a diagram schematically illustrating an example of a configuration and an operation of a resistance change element VR in an embodiment 6. In FIG. 16, the left illustration shows the state of the resistance change element, at the time of the On writing, that is, when a potential Vb1 of the electrode (metal layer M1) on the side of the bit line BL is zero, and when a positive voltage Vp1 is applied to the electrode (metal layer M2) on the side of the plate line.

A factor in the configuration in which the On state is easily unstabilized may, for example, be a state in which the initial resistance of the resistance change element VR is low, and a leaky current flows between the electrodes. In this embodiment the "low" initial resistance indicates that a resistivity of the resistance change layer VRL is 1e6 Ω·cm or lower. It depends also on the dimension of the ReRAM. In this case, a remarkable effect can be attained by applying the On writing method described in the embodiments 1 to 5.

When the initial resistance is low, as illustrated in the left upper stage of FIG. 16, a plurality of current paths (illustrated with arrows in the illustration) undesirably exist at the time of forming a current conduction path and at the time of the On writing. Thus, a sufficient current is not supplied to those places for forming the conductive filament FI, and the conductive filament FI having very low density of oxygen vacancy Vo (white dots in the illustration) is easily formed.

In the case where the initial resistance of the resistance change element VR is low, for example, in the initial state before the forming, the oxygen vacancy Vo may have already been introduced in the resistance change layer VRL. Specifically, for example, the metal layer M2 (that is, the electrode on the side to which a positive voltage is applied at the time of the On writing) has a configuration including metal with an effect of pulling out oxygen from the resistance change layer VRL. A determination as to whether the metal layer M2 has the effect of pulling out oxygen from the resistance change layer VRL is made based on the material used in the metal layer M2 and the physical property of the material of the resistance change layer VRL. That is, when the material used in the metal layer M2 has a characteristic of reacting with oxygen easier than the material of the resistance change layer VRL, the metal layer M2 has the effect of pulling out oxygen from the resistance change layer VRL.

Upper side of FIG. 16 illustrates the state of the resistance change element VR, at the time of the Off writing, that is, when a potential Vp1 of the electrode (metal layer M2) on the side of the plate line PL is zero, and when a position voltage Vb1 is applied to the electrode (metal layer M1) on the side of the bit line.

In the configuration in which the Off state is easily stabilized, specifically, for example, the material forming the metal layer M1 (that is, the side on the side to which a positive voltage is applied at the time of Off writing) is any of noble metals, such as ruthenium, platinum, gold, and iridium that do not react with oxygen. In this configuration, if the Off writing is performed, oxygen O (black dots in the illustration) is easily accumulated at the boundary with the metal layer M1 of the resistance change layer VRL. If the On writing is performed in this state, the oxygen vacancy Vo disappears due to the reaction of the oxygen O and the oxygen vacancy Vo in the conductive filament FI, and the conductive filament FI easily becomes thin or at a low density, resulting in a factor of unstabilization of the On state. Thus, in this configuration, a remarkable effect can be attained by applying the On writing method described in the above-described embodiments 1 to 5.

As described above, in the ReRAM of the embodiment 6, the On writing method described in the embodiments 1 to 5 is applied to the resistance change element VR having the configuration whose On state is easily unstabilized, in other words, having the configuration in which Off state is easily stabilized than the On state, thereby attaining the remarkable effect of stabilizing the On state.

Embodiment 7

In the above-described embodiments 1 to 6, as illustrated in FIG. 2, the descriptions have been made to the memory cell MC storing one bit information and having the configuration including one resistance change element VR and one selection transistor TR, by way of example. However, the method described in each of the embodiments may be applied also to so-called a cross point type ReRAM.

Figure 17:
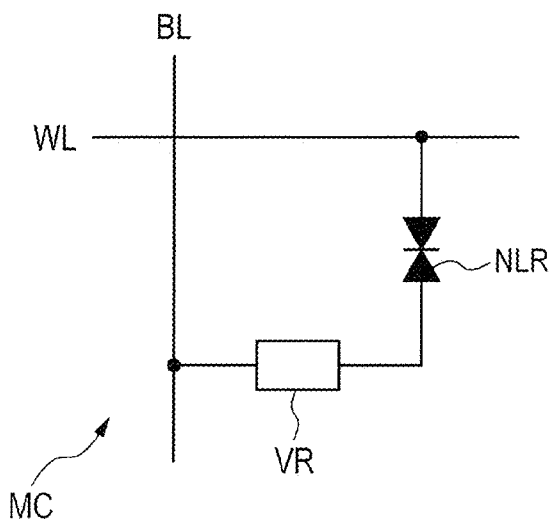
FIG. 17 is a diagram schematically illustrating a configuration example of a memory cell of a cross point type ReRAM.

FIG. 17 is a diagram schematically illustrating a configuration example of a memory cell of a cross point type ReRAM. As illustrated, the resistance change element VR is coupled to a word line and a bit line BL without through a switch. It is preferred that a nonlinear resistance element NLR be coupled to a resistance change element VR in series. No limitation is made to either of a metal layer M1 and a metal layer M2 in the resistance change element VR, to be coupled to the bit line BL. However, descriptions will hereinafter be made to the assumption that the metal layer M1 is coupled to the bit line BL.

Figure 18:
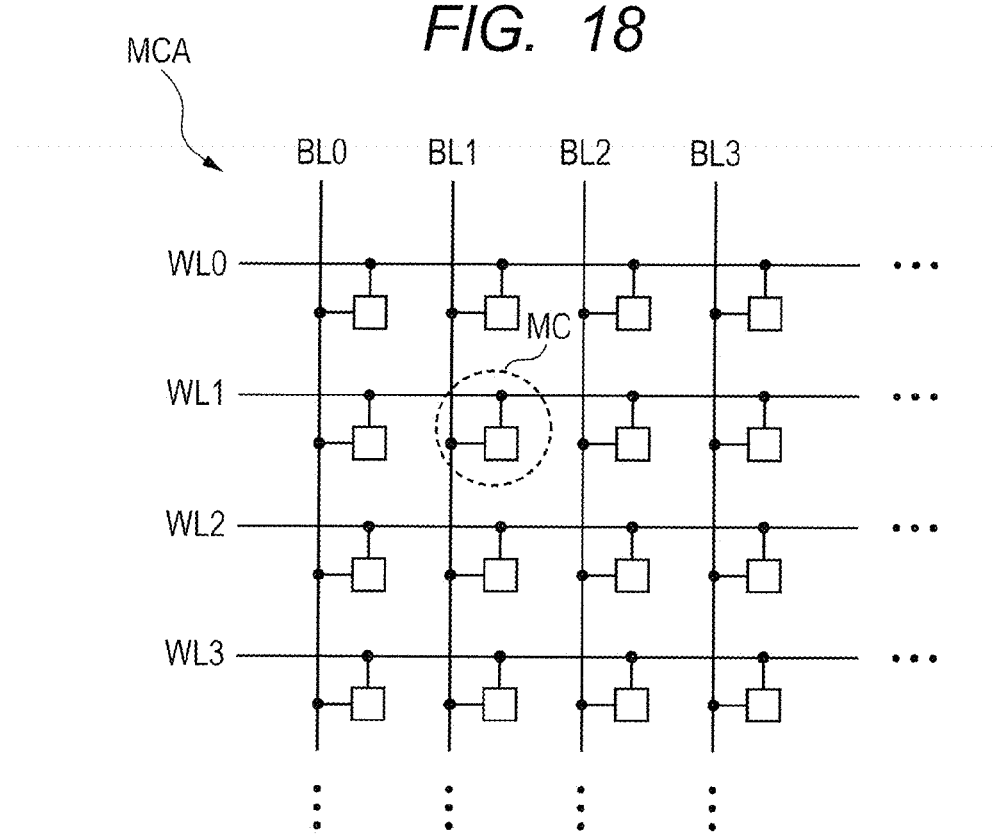
FIG. 18 is a diagram schematically illustrating a configuration example of a memory cell array in the cross point type ReRAM.

FIG. 18 is a diagram schematically illustrating a configuration example of a memory cell array in a cross point type ReRAM. A memory cell array MCA is configured by arranging the memory cells MC of FIG. 17 in matrix. In the example of the memory cell array MCA of FIG. 18, the configuration has a memory capacity of 16 bits in a matrix of 4 rows and 4 columns. It is possible to realize a large memory capacity by appropriately increasing the rows and columns of the array.

The memory cells MC are coupled respectively at the intersection points of word lines WL0 to WL3 and bit lines BL0 to BL3. The entire word lines WL0 to WL3 and the bit lines BL0 to BL3 are coupled to a non-illustrative control circuit at the peripheral part of the memory cell array MCA. For example, the word lines WL0 to WL3 are coupled to a non-illustrative word line control circuit in the memory cell array MCA on the left of the illustration. The bit lines BL0 to BL3 are coupled to a non-illustrative bit line control circuit on the upper stage of the illustration.

Each of the control circuits performs writing, by applying a voltage appropriately to the bit lines and the word lines, to control a desired memory cell MC to be in a high resistance state or a low resistance state. Alternatively, reading is performed upon detection of a current flowing to the bit line or the word line, and based on a determination as to whether a desired memory cell is in a high resistance state or a low resistance state.

For example, for the writing for the memory cell MC (enclosed with a dotted-line circle) to be in the On state, the word line WL1 may be at a high potential. In addition, the bit line BL1 may be at zero potential, and the word lines WL0, WL2, WL3, and the bit lines BL0, BL2, BL3 may be at ½ of the high potential. On the contrary, for the writing for the memory cell MC enclosed with a dotted-line circle to be in the Off state, the word line WL1 may be at zero potential, and the bit line BL1 may be at a high potential. The rest of the word lines WL0, WL2, WL3, and the bit lines BL0, BL2, BL3 may be at ½ potential.

To read whether the memory cell MC enclosed with the dotted-line circle is in the On state or the Off state, the bit line BL1 may be at zero potential, and the rest of the bit lines BL0, BL2, BL3, and the entire word lines WL0 to WL3 may be at a high potential (sufficiently lower than that at the writing), to detect the current flowing to the word line WL1.

According to the above operation, a high potential is applied to both ends of only the memory cell MC coupled to the word line WL1 and the bit line BL1. To any other memory cell MC, ½ of the high potential or zero potential is applied. As a result, the writing or reading is performed only for the memory cell MC enclosed with the dotted-line circle. The same applies to writing or reading for any other memory cells MC.

The nonlinear resistance element NLR in the memory cell MC illustrated in FIG. 17 has a characteristic that it has a high resistance when a potential difference between both ends is small, and has a low resistance when the potential difference is large. Thus, there is provided a function for reducing the voltage applied to the resistance change element VR and preventing erroneous writing or erroneous reading, in another memory cell MC sharing the bit line BL1 or the word line WL1 with the memory cell MC enclosed with the dotted-line circle in FIG. 18, that is, the memory cell MC to which a ½ voltage of the high potential may possibly be applied.

Even in the above cross point type ReRAM, it is possible to apply the method described in the above-described embodiments 1 to 6. After applying first a short On pulse at the time of performing the On writing, in a predetermined memory cell MC, a pulse with a small absolute value and having the same polarity (that is, the opposite polarity as that of the On pulse) as the pulse at the time of the Off writing is applied. After this, by following the sequence for applying the long On pulse, it is possible to improve the retention characteristic of the On state while securing the memory window.

Accordingly, the detailed descriptions have been made to the inventions presented by the present inventors, based on the embodiments. However, needless to say, the present invention is not limited to the above-described embodiments, and various changes may possibly be made without departing from the scope thereof.

What is claimed is:

1. A semiconductor device comprising:
   memory cells each of which includes a resistance change element; and
   a control circuit which can perform a first writing process for applying, to the memory cell, a first writing pulse for controlling a state of the memory cell to be in a first resistance state in which a resistance value of the resistance change element is lower than a first reference value, and a second writing process for applying a second writing pulse with an opposite polarity to the first writing pulse for controlling the state of the memory cell to be in a second resistance state in which the resistance value of the resistance change element is greater than or equal to a second reference value,
   wherein the control applies, in the first writing process, a first pulse having a same polarity as that of the first writing pulse and having a pulse width shorter than that of the first writing pulse, and a second pulse having a same polarity as that of the second writing pulse, sequentially in this order, before applying the first writing pulse to the memory cell.

2. The semiconductor memory device according to claim 1,
   wherein the control circuit applies, in the first writing process, a set of the first pulse and the second pulse for a plurality of number of times, before applying the first writing pulse to the memory cell.

3. The semiconductor memory device according to claim 1,
   wherein a voltage of the first pulse is equal to or greater than a voltage of the first writing pulse.

4. The semiconductor memory device according to claim 1,
   wherein, after the first writing process, the control circuit performs a verify process including applying a read pulse for reading whether the resistance change element is in the first resistance state or the second resistance state, performing the first writing process again when the memory cell is not in the first resistance state, and applying the read pulse again to read whether the resistance change element is in the first resistance state or the second resistance state.

5. The semiconductor memory device according to claim 1,
   wherein, after the first writing process, the control circuit performs a verify process including applying a read pulse for reading whether the resistance change element is in the first resistance state or the second resistance state, applying the first writing pulse to the memory cell when the memory cell is not in the first resistance state, and applying the read pulse again to read whether the resistance change element is in the first resistance state or the second resistance state.

6. The semiconductor memory device according to claim 1,
   wherein, after the first writing process, the control circuit performs a verify process including applying a read pulse for reading whether the resistance change element is in the first resistance state or the second resistance state, applying the second pulse to the memory cell and then applying the first writing pulse again when the memory cell is not in the first resistance state, and applying the read pulse again thereafter to read whether the resistance change element is in the first resistance state or the second resistance state.

7. The semiconductor memory device according to claim 4,
   wherein the control circuit repeats the verify process until the resistance change element is in the first resistance state or until reaching a predetermined upper limit number of times.

8. The semiconductor memory device according to claim 1,
   wherein, in the second writing process, after applying the second writing pulse to the memory cell, the control circuit applies a third pulse having a same polarity as that of the second writing pulse and having a voltage lower than the second writing pulse, until the first writing process is performed next time.

9. The semiconductor memory device according to claim 1,
   wherein, of two electrodes sandwiching a resistance change layer therebetween for forming the resistance change element, a first metal layer for forming an electrode on a side where a positive voltage is applied at a time of performing the first writing process includes metal having a characteristic of reacting with oxygen easier than a material for forming the resistance change element.

10. The semiconductor memory device according to claim 1,
    wherein, of two electrodes sandwiching a resistance change layer therebetween for forming the resistance change element, a second metal layer for forming an electrode on a side where a positive voltage is applied at a time of performing the second writing process includes some of predetermined noble metals.

* * * * *